(12) United States Patent
Bukkems et al.

(10) Patent No.: US 11,808,417 B2
(45) Date of Patent: Nov. 7, 2023

(54) LED FILAMENT DEVICE PLEASANT IN APPEARANCE AND IMPROVED SPATIAL LIGHT DISTRIBUTION THROUGH THE FORMATION OF INTENTIONAL COMPLICATIONS IN CORDAGE

(71) Applicant: SIGNIFY HOLDING B.V., Eindhoven (NL)

(72) Inventors: Peter Johannes Martinus Bukkems, Deurne (NL); Ties Van Bommel, Horst (NL); Rifat Ata Mustafa Hikmet, Eindhoven (NL); Johannes Petrus Maria Ansems, Hulsel (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 17/628,450

(22) PCT Filed: Jul. 15, 2020

(86) PCT No.: PCT/EP2020/070041
§ 371 (c)(1),
(2) Date: Jan. 19, 2022

(87) PCT Pub. No.: WO2021/013656
PCT Pub. Date: Jan. 28, 2021

(65) Prior Publication Data
US 2022/0364691 A1    Nov. 17, 2022

(30) Foreign Application Priority Data
Jul. 22, 2019  (EP) .................................... 19187505

(51) Int. Cl.
*F21S 4/15* (2016.01)
*F21V 9/30* (2018.01)
(Continued)

(52) U.S. Cl.
CPC ................ *F21S 4/15* (2016.01); *F21K 9/232* (2016.08); *F21S 4/24* (2016.01); *F21V 9/30* (2018.02)

(58) Field of Classification Search
CPC .... F21S 4/15; F21S 4/24; F21K 9/232; F21V 9/30
See application file for complete search history.

(56) References Cited

U.S. PATENT DOCUMENTS

| | | | |
|---|---|---|---|
| 6,394,623 B1 | 5/2002 | Tsui | |
| 6,575,595 B1 * | 6/2003 | Wu | .......................... F21S 4/15 362/249.16 |

(Continued)

FOREIGN PATENT DOCUMENTS

| | | | |
|---|---|---|---|
| CN | 201032092 Y | | 3/2008 |
| CN | 208271890 U | * | 12/2018 |

(Continued)

OTHER PUBLICATIONS

Feng et al., CN 208271890 U, machine tranlation, Dec. 2018 (Year: 2018).*

(Continued)

*Primary Examiner* — Tracie Y Green (57) ABSTRACT

A light emitting device (1) comprising at least one LED filament (2) comprising a flexible substrate (3) and a plurality of LED light sources (4) arranged on the flexible substrate (3), and an encapsulation (5a, 5b) encapsulating the plurality of LED light sources (4) and at least a part of one side of the flexible substrate (3), where the at least one LED filament (2) comprises at least one knot (6) in the form of intentional complication in cordage of the at least one LED filament (2), and where the intentional complication in cordage is any one of a fastening made by looping the at least one LED filament (2) on itself or together with a further LED filament and tightening it, and an intentional compli- (Continued)

cation in cordage in which the at least one LED filament (2) is interlaced with at least one further LED filament at right angles to one another.

14 Claims, 5 Drawing Sheets

(51) Int. Cl.
*F21S 4/24* (2016.01)
*F21K 9/232* (2016.01)

(56) References Cited

U.S. PATENT DOCUMENTS

| 10,527,233 | B2 * | 1/2020 | Jiang | H01L 33/62 |
| 10,544,905 | B2 * | 1/2020 | Jiang | F21K 9/232 |
| 11,187,387 | B1 * | 11/2021 | Yan | F21K 9/238 |
| 2009/0212698 | A1 * | 8/2009 | Bailey | F21K 9/232 313/512 |
| 2014/0268779 | A1 * | 9/2014 | Sorensen | F21K 9/232 362/249.06 |
| 2014/0321126 | A1 * | 10/2014 | Narag | F21V 21/14 362/306 |
| 2017/0227169 | A1 * | 8/2017 | Jiang | F21V 3/02 |
| 2019/0086036 | A1 * | 3/2019 | Hofmann | F21K 9/232 |
| 2020/0144230 | A1 * | 5/2020 | Lin | H01L 33/62 |

FOREIGN PATENT DOCUMENTS

| DE | 102017129994 A1 | 6/2019 |
| WO | 2018053519 A1 | 3/2018 |

OTHER PUBLICATIONS

Feit_Electric_Introduces_Vintage_Style_LED_Lighting_with_a_Twist_-_Feit_Electric_06-2017.pd (Year: 2017).*

* cited by examiner

LED FILAMENT DEVICE PLEASANT IN APPEARANCE AND IMPROVED SPATIAL LIGHT DISTRIBUTION THROUGH THE FORMATION OF INTENTIONAL COMPLICATIONS IN CORDAGE

CROSS-REFERENCE TO PRIOR APPLICATIONS

This application is the U.S. National Phase application under 35 U.S.C. § 371 of International Application No. PCT/EP2020/070041, filed on Jul. 15, 2020, which claims the benefit of European Patent Application No. 19187505.3, filed on Jul. 22, 2019. These applications are hereby incorporated by reference herein.

FIELD OF THE INVENTION

The present invention relates to a light emitting device comprising at least one LED filament comprising a flexible substrate and a plurality of LED light sources arranged on the flexible substrate, and an encapsulation encapsulating the plurality of LED light sources and at least one side of the flexible substrate.

It is noted that as used herein, the word "knot" is in the broadest sense intended to mean and encompass any intentional complication in cordage which may be useful or decorative, including especially knots and hitches, and also weavings, but notably excluding braids. More particularly, the word "knot" as used herein is intended to mean a complication in cordage in the form of a fastening made by looping a piece of string, rope, or something similar, according to the invention particularly a flexible LED filament, on itself or together with another piece of string, rope, or something similar, according to the invention particularly a further flexible LED filament or other filament, and tightening it. Further reference is made to https://www.britannica.com/technology/knot-cording, where it is stated that "In the narrow sense of the term, a knot is a knob made on a rope by turning the rope in on itself through a loop"

Figure 1:
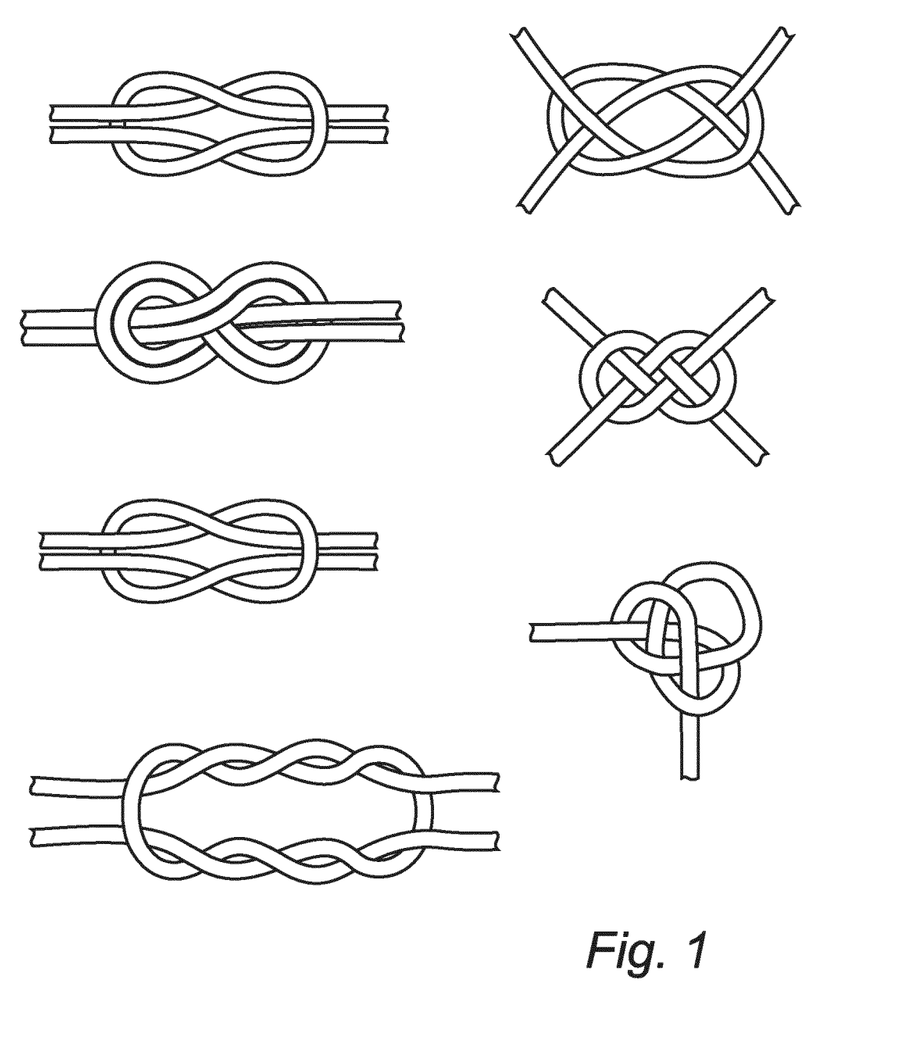
FIG. 1 illustrates non-limiting examples of knots and hitches, which may be provided on one two (or in principle more) LED filaments of a light emitting device according to the invention.
Figure 6:
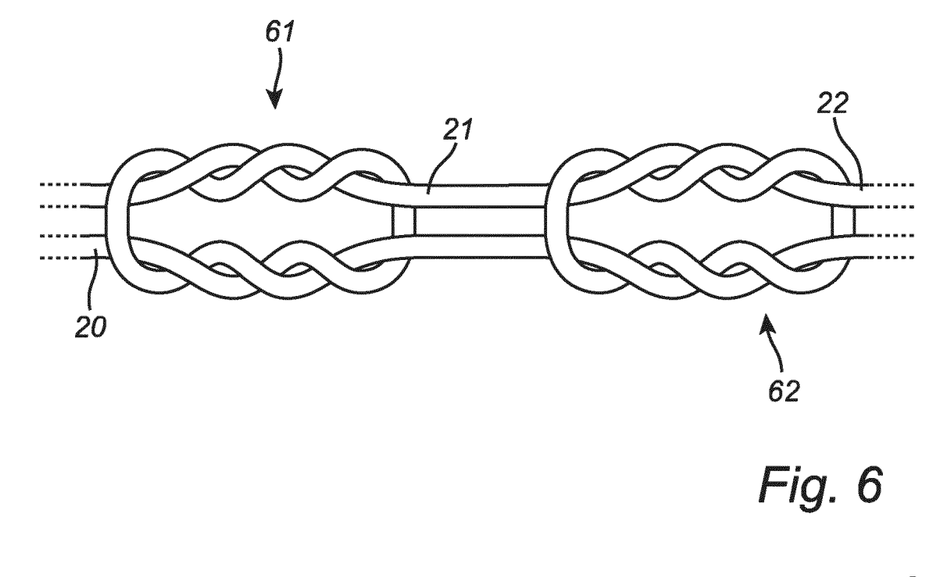
FIG. 6 shows a top view of a light emitting device according to the invention with three LED filaments and two knots.

FIG. 1 illustrates non-limiting examples of knots and hitches, while FIG. 6 shows an example of a weaving.

It is further noted that as used herein, the term "weaving" is intended to refer more specifically to a complication in cordage in which two distinct sets of yarns or threads, according to the invention particularly flexible LED filaments, are interlaced at right angles to one another.

BACKGROUND OF THE INVENTION

Incandescent lamps are rapidly being replaced by LED based lighting solutions. It is nevertheless still appreciated and desired by users to have retrofit lamps which have the look of an incandescent bulb. For this purpose, one can simply make use of the infrastructure for producing incandescent lamps based on glass and replace the filament with LEDs emitting white light. One of the concepts is based on LED filaments placed in such a bulb. The appearances of these lamps are highly appreciated as they look highly decorative. There is consequently a very big market for this type of LED filament lamp.

CN 201032092 Y shows an example of such a LED based lamp, in which a plurality of LED filaments is provided in a loose flat plaid-like structure in which the filaments twist around each other. However, the LED filaments are in this solution not connected or in contact with one another, nor no they have a satisfactory spatial light distribution.

It is desired to have a LED filament with a pleasant appearance. It is further desired to improve the spatial light distribution of LED filaments. It is further desired to (locally) improve the brightness of LED filaments (e.g. for beam shaping or shadowing purposes in a luminaire). It is further desired to easily combine and/or connect different filaments with one another.

Within the context of the present invention, a LED filament is understood to provide LED filament light and comprises a plurality of light emitting diodes (LEDs) arranged in a linear array. Preferably, the LED filament has a length L and a width W, wherein L>5W. The LED filament may be arranged in a straight configuration or in a non-straight configuration such as for example a curved configuration, a 2D/3D spiral or a helix. Preferably, the LEDs are arranged on an elongated carrier like for instance a substrate, that may be rigid (made from e.g. a polymer, glass, quartz, metal or sapphire) or flexible (e.g. made of a polymer or metal e.g. a film or foil).

In case the carrier comprises a first major surface and an opposite second major surface, the LEDs are arranged on at least one of these surfaces. The carrier may be reflective or light transmissive, such as translucent and preferably transparent.

The LED filament may comprise an encapsulant at least partly covering at least part of the plurality of LEDs. The encapsulant may also at least partly cover at least one of the first major or second major surface. The encapsulant may be a polymer material which may be flexible such as for example a silicone. Further, the LEDs may be arranged for emitting LED light e.g. of different colors or spectrums. The encapsulant may comprise a luminescent material that is configured to at least partly convert LED light into converted light. The luminescent material may be a phosphor such as an inorganic phosphor and/or quantum dots or rods.

The LED filament may comprise multiple sub-filaments.

SUMMARY OF THE INVENTION

It is an object of the present invention to overcome the above-mentioned problem, and to provide a light emitting device with one or more LED filaments with a pleasant appearance and with improved spatial light distribution and/or at least locally improved brightness of LED filaments.

It is a further object to provide such a light emitting device with which it is easy to combine and/or connect different filaments with one another.

According to a first aspect of the invention, these and other objects are achieved by means of a light emitting device comprising a number of LED filaments, each filament comprising a flexible substrate and a plurality of LED light sources arranged on the flexible substrate, and an encapsulation encapsulating the plurality of LED light sources and at least a part of one side of the flexible substrate, where the at least one LED filament of said number of LED filaments comprises at least one knot in the form of intentional complication in cordage of the at least one LED filament, and where the intentional complication in cordage is any one of a fastening made by looping the at least one LED filament on itself or together with a further LED filament of the number of filaments and tightening it, and an intentional complication in cordage in which the at least one LED filament is interlaced with at least one further LED filament at right angles to one another.

In this context, the wording 'a number of' has been chosen to indicate that there may be at least one filament, or a plurality of filaments, but also one filament is included. Further, right is to be interpreted to include angles in an interval between 70 and 110 degrees, and not being restricted to orthogonal only.

Thereby, and especially by providing that the at least one LED filament comprises at least one knot in the form of intentional complication in cordage of the at least one LED filament, where the intentional complication in cordage is any one of a fastening made by looping the at least one LED filament on itself or together with a further LED filament and tightening it, and an intentional complication in cordage in which the at least one LED filament is interlaced with at least one further LED filament at right angles to one another, a light emitting device with one or more LED filaments with a pleasant appearance and with improved spatial light distribution and/or at least locally improved brightness of LED filaments is provided for.

Furthermore, by providing an encapsulation encapsulating the plurality of LED light sources and at least one side of the flexible substrate, the flexibility of the LED filament is improved and the risk of the LED filament breaking or cracking when being bent to be tied to a knot is reduced. This in turn makes it easier to provide the LED filament with the knot.

Also, to add further light intensity and flexibility to the light emitting device, the further LED filament may also comprise a flexible substrate and a plurality of LED light sources arranged on the flexible substrate, and an encapsulation encapsulating the plurality of LED light sources and at least a part of one side of the flexible substrate.

In an embodiment the light emitting device comprises a plurality of LED filaments, where the plurality of LED filaments comprises at least one knot in the form of intentional complication in cordage of one or two LED filaments of the plurality of LED filaments and where the intentional complication in cordage is any one of a fastening made by looping one LED filament of the plurality of LED filaments on itself or together with a further LED filament of the plurality of LED filaments and tightening it, and an intentional complication in cordage in which at least one LED filament of the plurality of LED filaments is interlaced with at least one further LED filament of the plurality of LED filaments at right angles to one another.

In addition to the above-mentioned advantages, a light emitting device is thereby provided with which it is particularly easy to combine and/or connect different filaments with one another.

Furthermore, in case the knot is provided as a weaving, it becomes possible to provide such a light emitting device with decorative light emitting surfaces based on flexible LED filaments. Such light emitting surfaces can be flat or curved and arranged into a decorative lighting fixture.

In an embodiment the at least one LED filament, or the one or two LED filaments of the plurality of LED filaments, comprise more than one knot.

Thereby, a light emitting device is provided which has a greater versatility in terms of appearance of the LED filaments as seen by an observer.

In an embodiment at least two of the plurality of LED filaments are connected to one another or tied together by the at least one knot.

Thereby, a light emitting device is provided with which it is not only particularly easy to combine and/or connect different filaments with one another, but which also has a very robust LED filament structure.

In an embodiment the at least one LED filament comprises at least one point of contact with itself within the at least one knot, or wherein at least two of the plurality of LED filaments comprise at least one point of mutual contact within the at least one knot.

It is noted that providing more than one knot, e.g. 2, 3 or 4 knots, are also possible. Thereby, a light emitting device is provided with which it is not only particularly easy to combine and/or connect different filaments with one another, but which also has a particularly robust LED filament structure, even for embodiments comprising only one LED filament. Further, when providing more knots, an even more robust LED filament structure is provided for.

In an embodiment the at least one knot is chosen from the group comprising an overhand knot, a double overhand knot, a figure 8 knot, a granny knot, a square knot, a woven knot and combinations thereof.

These types of knots have proved to provide an especially pleasant appearance and an especially improved spatial light distribution and locally improved brightness of LED filaments.

In an embodiment each LED filament of the plurality of LED filaments is adapted for, in operation, emitting light of the same color temperature. In another embodiment at least one LED filament of the plurality of LED filaments is adapted for, in operation, emitting light of a different color than that of the other LED filaments of the plurality of LED filaments.

Thereby, a light emitting device is provided which has a greater versatility in terms of color appearance of the LED filaments as seen by an observer.

In an embodiment the at least one LED filament comprises a reflective material, a luminescent material or a combination of a reflective material and a luminescent material.

Reflective materials have the advantage of enabling producing points emitting light in different directions, and thereby of providing the light emitting device with a greater uniformity in brightness irrespective of the angle of view.

Luminescent materials have the advantage of enabling the production of colorful textures which in the far field lead to high quality light.

In an embodiment the concentration of the luminescent material varies along a longitudinal extension of the at least one LED filament and/or between LED filaments.

This provides for a greater versatility in terms of the types of colorful textures achievable.

In an embodiment the light emitting device further comprises at least one luminescent filament. The luminescent filament may or may not comprise LEDs.

In an embodiment the light emitting device further comprises at least one light guiding filament. The light guiding filament may or may not comprise LEDs.

Thereby a light emitting device is provided with which it becomes possible to produce colorful textures which in the far field lead to high quality light.

In order to improve the spatial distribution of the light emitted by the light emitting device even further, the luminescent filament may also form part of the at least one knot.

In an embodiment a thickness of the encapsulation varies along a longitudinal extension of the at least one LED filament and/or between LED filaments.

This provides for enabling varying flexibility along the LED filament, such as to, for instance, improve the flexibility of the LED filament more in the area where a knot is to be formed as compared to other areas. This in turn may provide for a saving of encapsulation material.

In an embodiment the encapsulation encapsulates the flexible substrate on both sides.

Thereby, a further improved flexibility of the LED filament is provided for, which in turn improves the protection of the LED filament against breaking or cracking when bent to form the at least one knot.

In some embodiments, the encapsulation is made of a polymer material, such as a silicone. In some embodiments, the encapsulation comprises a luminescent material, such as e.g. a green, yellow and/or red phosphor. In some embodiments, the encapsulation comprises a scattering material, such as e.g. $BaSO_4$, $Al_2O_3$, and/or $TiO_2$ particles.

A luminescent material converts LED light into converted LED light.

The LED filament provides LED filament light. The LED filament light comprises LED light and/or converted light.

In an embodiment the flexible substrate is light transmissive. The flexible substrate may also be semi-reflective e.g. scattering or transparent.

This enables also covering the LEDs arranged on the LED filament with the flexible substrate without affecting the light output of the light emitting device negatively. This in turn provides for a more robust and durable light emitting device.

In an embodiment the light emitting device further comprises a controller configured to control the at least one LED filament or to individually control at least two LED filament of the plurality of LED filaments.

Thereby a light emitting device is provided having a high versatility in terms of the light outputs achievable, and which may thus easily be adapted to a particular use or lighting purpose. By means of the controller, this may even be achieved directly by the end user.

The invention furthermore, in a second aspect, concerns a lamp, a luminaire, or a lighting fixture, or a shade for a lamp, a luminaire or a lighting fixture, comprising a light emitting device according to the invention.

Such a lamp, a luminaire or a lighting fixture may be a lamp, a luminaire or a lighting fixture, for instance a spot module, for retail or shop illumination, for architectural lighting or for outdoor lighting purposes.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 2:
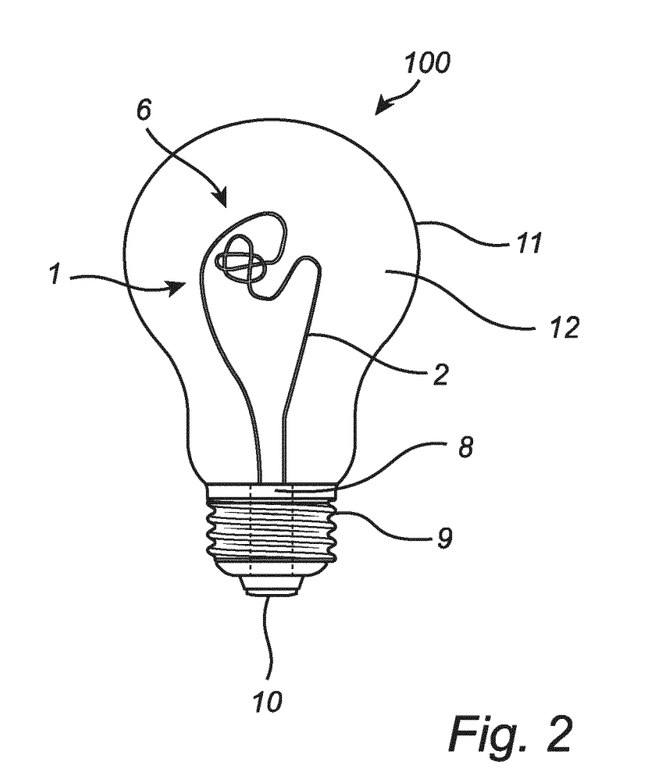
FIG. 2 shows a schematic view of a light bulb with a light emitting device according to the invention.

FIG. 2 shows a schematic view of a light bulb 100 with a light emitting device 1 according to the invention. The light bulb comprises a socket 9 with a terminal 10 for electrical connection to a power source and a glass bulb 11 with a cavity 12 filled with a suitable gas, particularly an inert gas.

The light emitting device 1 according to the invention generally and irrespective of the embodiment comprises at least one LED filament 2. In the embodiment shown in FIG. 2 the light emitting device 1 comprises one LED filament 2. In the embodiment shown in e.g. FIG. 3, two LED filaments 20 and 21 are provided.

The at least one LED filament 2 is connected to an optional controller 8. The controller 8 is configured to control the at least one LED filament 2, and may in other embodiments be configured to individually control each of the two LED filaments 21 and 22. The controller 8 may be configured to individually control the color, color temperature, intensity or the like of the light emitted by the at least one LED filament 2, or by the two or more LED filaments 20, 21.

The at least one LED filament 2 comprises a plurality of LEDs 4 (cf. e.g. FIGS. 4 and 8) arranged along the longitudinal extension of the LED filament 2. The LEDs 4 may be arranged with regular spacing or with irregular spacing or a combination thereof. The LEDs 4, and thus the LED filaments 2, 20, 21, 22, may be configured to emit light of any feasible and desired color temperature. For instance, in the embodiment shown in FIG. 4, the two LED filaments are adapted for, in operation, emitting light of the same color temperature. For instance, in the embodiment shown in FIG. 3, the two LED filaments are adapted for, in operation, emitting light of mutually different color temperatures. The plurality of LEDs 4 may further be arranged on one or both surfaces of the flexible substrate 3. The LEDs 4 may be colored LEDs e.g. red, green, and/or blue LEDs. The LEDs 4 may also be UV and/or blue LEDs. The LED filament 2 may have more than 20 LEDs, more than 40 LEDs, or even more than 50 LEDs. The LEDs 4 may be arranged in a linear manner. The flexible substrate 3 may be transparent or light transmissive. The lighting device and/or the LED filaments may provide white light. The white light may be within 10 SDCM from the BBL, within 8 SDCM, or within 5 SDCM. The color temperature of the white light may be in the range from 2000 K to 6000 K, in the range from 2100 K to 5000 K, or in the range from 2200 K to 4000 K, such as for example 2700 K or 3000 K. The color rendering index of the white light may be at least 80, at least 85, or at least 88 such as for example 90.

Generally, and irrespective of the embodiment, the at least one LED filament 2 comprises at least one knot 6. In the embodiment shown in FIG. 2 one knot 6 is provided. The knot 6 may be provided at any location on the at least one filament, such as but not limited to at the top of the envelope or at the center of the envelope.

The at least one knot 6 may comprise any one or more of the following knot components. A bight, being any curved section, slack part or loop between the ends of a LED filament. A bitter end, being an end of a LED filament that is tied off. A loop, being a curve narrower than a bight but with separate ends. An elbow being two crossing points created by an extra twist in a loop or a circle of a LED filament. A turn or a single turn, being a curve with crossed legs. One or more round turns, a round turn being a complete encirclement of an imaginary or real object.

Likewise, the LED filament 2 provided with the knot 6 may comprise one or more of the following. A standing end, being the longer end of the LED filament 2 not involved in the knot 6. A standing part, being a section of the LED filament 2 between the knot 6 and a standing end. A working end, being the end of the LED filament 2 used in making the knot.

Figure 3:
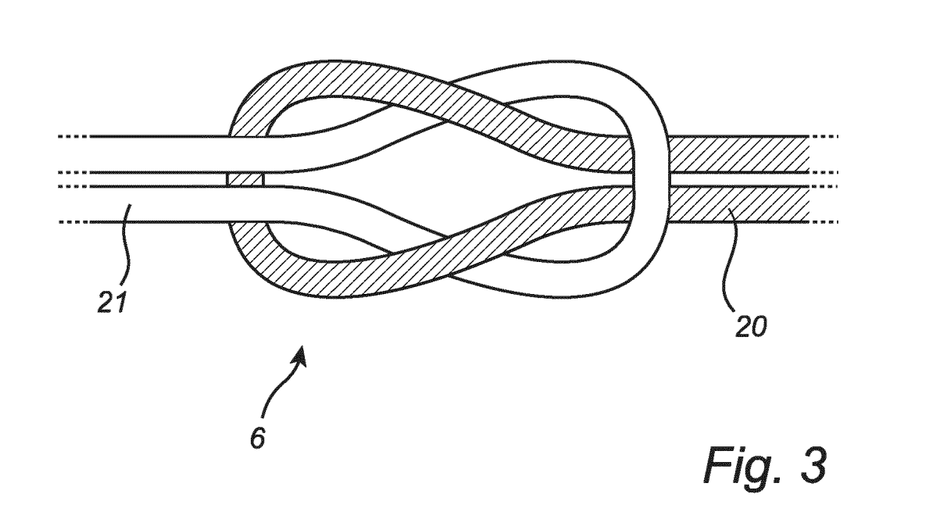
FIG. 3 shows a top view of a first embodiment of a light emitting device according to the invention with two LED filaments and a knot.

FIG. 3 shows an exemplary knot 6 of a light emitting device according to the invention in further detail. The knot 6 is in this case a square knot. As can be seen FIG. 3 illustrates an embodiment in which the two LED filaments 20, 21 are adapted for, in operation, emitting light of different color temperatures.

FIG. 1 shows further examples of various non-limiting embodiments of knots 6 according to the invention. The knot 6 according to the invention may for instance belong to the category of hitches, bends, splices or knots of the category serving as a stopper or knob at the end of a strand to keep that end of the strand from slipping through a grommet or eye. More specifically, the knot 6 according to the invention may be provided with the structure of any one of a bend, a binding, a coil knot, a decorative knot, a hitch, a lashing, a loop, a slip knot, a slipped knot, a seizing, a splice, a stopper and a whipping. Even more specifically, the knot 6 according to the invention may for instance be an overhand knot, a double overhand knot, a figure 8 knot, a granny knot, a square knot and a woven knot. Combinations of such knots and/or categories of knots, as well as other specific types of knots, are also feasible.

Figure 4:
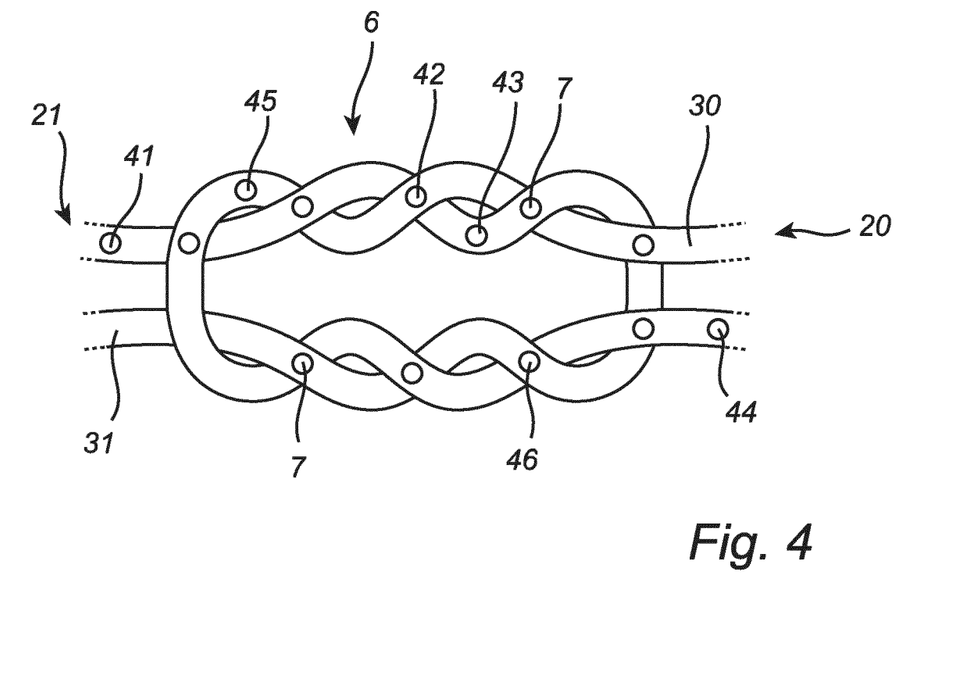
FIG. 4 shows a top view of a second embodiment of a light emitting device according to the invention with two LED filaments and a knot.

Turning now to FIG. 4, a further embodiment of a knot 6 of a light emitting device according to the invention is shown. In this embodiment the knot 6 is in the form of a square knot with extra passes. Thus, two LED filaments 20 and 21 are provided. The LED filaments 20 and 21 comprise a plurality of LEDs 41-46. The LED filaments 20 and 21 also comprise a plurality of points 7 of mutual contact within the knot 6. The LEDs and the points of mutual contact may be coincident, such as would be the case for instance at LEDs 42 and 46. Alternatively, or additionally, the LEDs may be arranged between point of mutual contact such as would be the case for instance at LEDs 43 and 45.

In any of the embodiments described herein, the knot 6 may be tightened or slacked according to need and desire. Obviously, if the knot 6 is tightened—or slacked—the points 7 of mutual contact within the knot 6 will shift, and so will the position of the LEDs 41-46 with respect to the points 7 of mutual contact within the knot 6.

Figure 5:
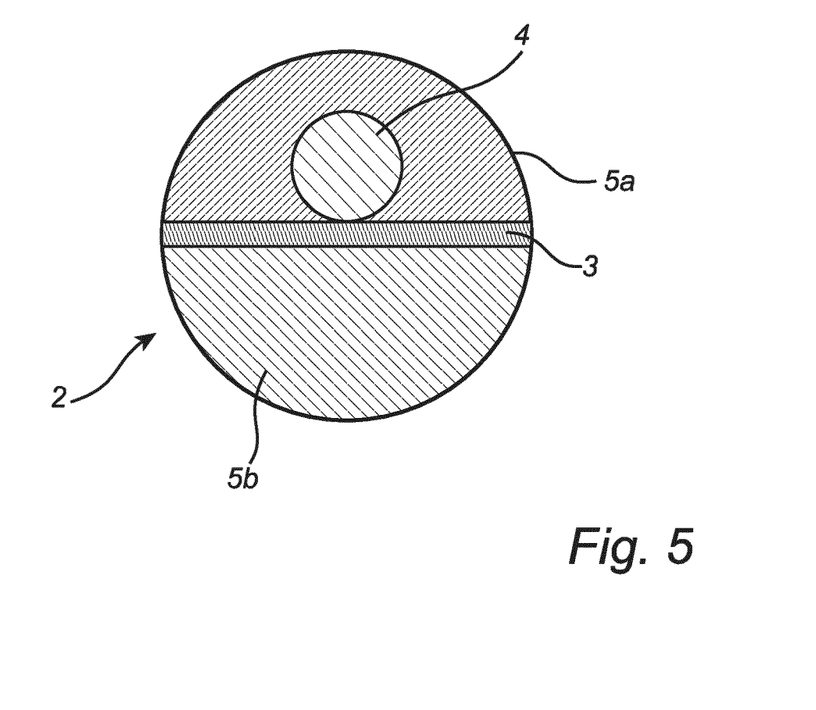
FIG. 5 shows a schematic cross sectional view of a LED filament of a light emitting device according to the invention.

FIG. 5 shows a cross-sectional view of an exemplary LED filament 2 according to the invention. Generally, and irrespective of the embodiment, the LED filament 2 comprises a flexible substrate 3, an LED 4 and an encapsulation 5a, 5b. The encapsulation 5a, 5b encapsulates at least the LED 4 and a part of the flexible substrate 3. The encapsulation 5a, 5b may encapsulate the flexible substrate 3 on one side or on both sides. In other words, the encapsulation part 5b shown on FIG. 5 is optional. Furthermore, the encapsulation 5a, 5b may vary in thickness along the length of the LED filament 2.

The encapsulation 5a, 5b may also comprise scattering elements, such as e.g. $Al_2O_3$, $BaSO_4$ and/or $TiO_2$ particles, or a scattering material, such as e.g. $Al_2O_3$, $BaSO_4$ and/or $TiO_2$. Additionally, or alternatively, the encapsulation 5a, 5b may comprise a luminescent material. The luminescent material may comprise a phosphor. The phosphor may be configured to partly or fully convert LED light into converted LED light. The LED light and/or converted LED light forms the light output of the LED filament 2.

FIG. 6 shows a further embodiment of LED filaments with knots of a light emitting device according to the invention. In this embodiment, three LED filaments 20, 21 and 22 are provided. The three LED filaments 20, 21 and 22 are provided with two knots 61 and 62. The two knots 61 and 62 are of the same type. Of course, more than two knots may also be provided. Also, the two or more knot may also be of different types.

Figure 7:
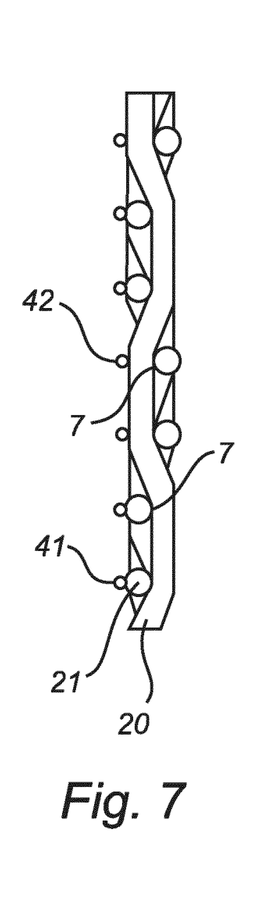
FIG. 7 shows a cross sectional side view of a light emitting device according to the invention with a plurality of LED filaments arranged in a woven configuration.
Figure 8:
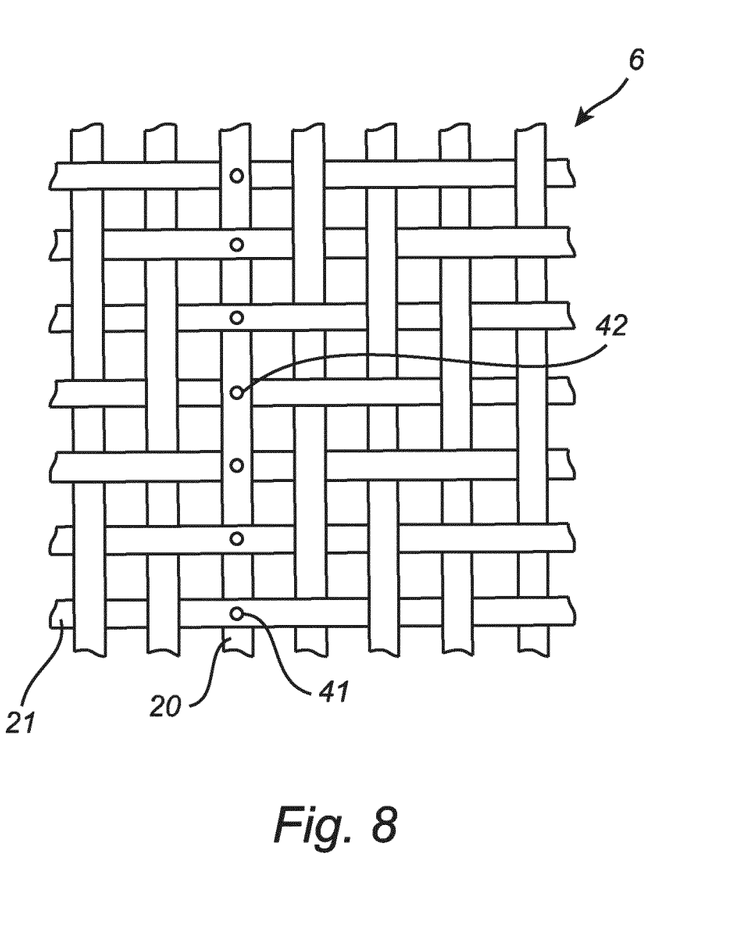
FIG. 8 shows a top view of the light emitting device according to FIG. 5.

FIGS. 7 and 8 shows a further embodiment of LED filaments with knots of a light emitting device according to the invention in a cross sectional side view and a top view, respectively. In this embodiment a plurality of LED filaments 20 and 21 are provided and are arranged in a woven pattern, in which the LED filaments 20 and 21 extend perpendicular to one another. As is clear from FIG. 8, the LED filaments 20 form warps, while the LED filaments 21 form wefts—or vice versa. LEDs 41, 42 are provided on the LED filaments 20, 21. Points 7 of mutual contact between the woven LED filaments 20, 21 are illustrated in FIG. 7.

With such a structure, it becomes possible to provide a light emitting device according to the invention with a decorative light emitting surface based on flexible LED filaments. Such surfaces can be flat or curved and arranged into a decorative lighting fixture. For instance, the thus woven LED filament structure may be arranged in the shape of a cylinder or a chimney or a cone or a frustum of a cone. In this embodiment, the light emitting device according to the invention may even be applied as or on a lamp shade.

Figure 9:
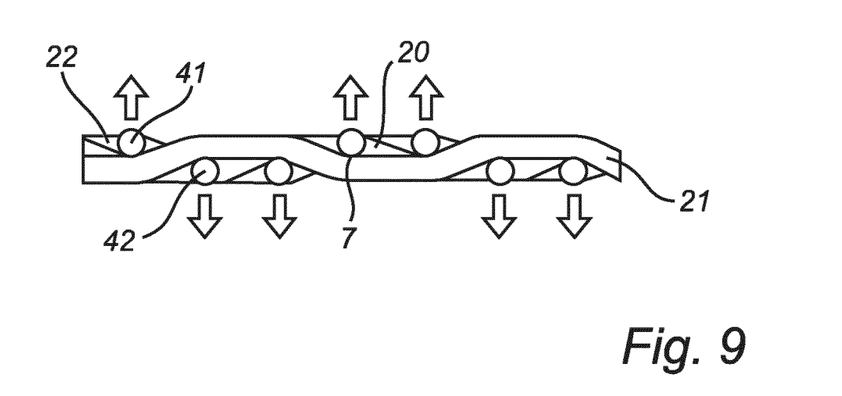
FIG. 9 shows a cross sectional side view of a light emitting device according to the invention where the LED filament comprises a reflective material.
Figure 10:
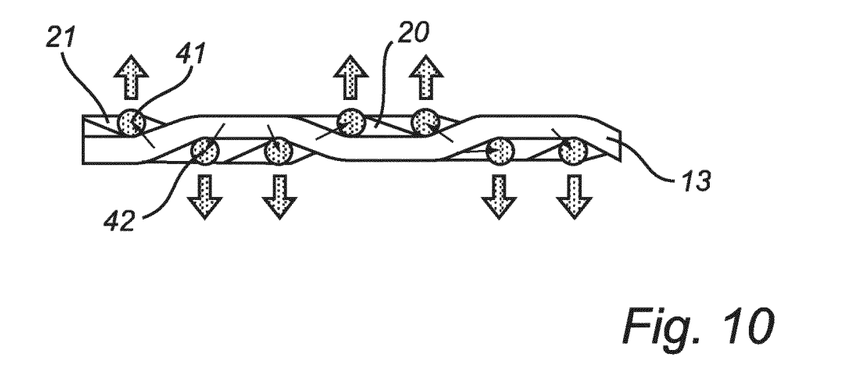
FIG. 10 shows a cross sectional side view of a light emitting device according to the invention and further comprising a luminescent filament.

FIGS. 9 and 10 show cross sectional side views of two further embodiment of LED filaments in a woven pattern.

In FIG. 9, the LEDs 41 and 42 are arranged such that light is emitted in one direction by the LEDs 41 and in another, opposite, direction by the LEDs 42. Furthermore, the LED filaments 20 and 22 are supplemented with an additional LED filament 21 comprising a reflective material.

Alternatively, or additionally, an additional filament or strand comprising a reflective material may be provided. In this way, reflective points may be provided for emission of light in different directions. In yet another alternative, one (or both) of the LED filaments 20 and 22 may comprise a reflective material. In this case, any additional filament or strand with a reflective material may be omitted. Reflection or scattering may also be obtained by using materials with differences in refractive indices, such as e.g. particles of glass in silicone.

In FIG. 10, the LEDs 41 and 42 are arranged such that light is emitted in one direction by the LEDs 41 and in another, opposite, direction by the LEDs 42. Furthermore, the LED filaments 20 and 21 are supplemented with an additional filament or strand 13 comprising a luminescent material. In this way colorful textures may be produced.

In another alternative, one (or both) of the LED filaments 20 and 21 may comprise a luminescent material. In this case, the additional filament or strand 13 may be omitted. In yet another embodiment, an additional filament 13 comprising a combination of a reflective material and a luminescent material may be provided, or one (or both) of the LED filaments 20 and 21 may comprise a combination of a reflective material and a luminescent material.

Obviously the embodiments of FIGS. 9 and 10 may also be incorporated in any of the embodiments according to FIGS. 1-6.

The person skilled in the art realizes that the present invention by no means is limited to the preferred embodiments described above. On the contrary, many modifications and variations are possible within the scope of the appended claims. For instance, the above described exemplary embodiments may be combined in any feasible way.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light emitting device comprising:
a plurality of LED filaments, each filament comprising a flexible substrate and a plurality of LED light sources arranged on the flexible substrate, and
an encapsulation encapsulating the plurality of LED light sources and at least a part of one side of the flexible substrate,
wherein at least two LED filaments of said plurality of LED filaments comprises at least one knot in the form of intentional complication in cordage of the at least two LED filaments,
wherein the intentional complication in cordage is a fastening made by looping the at least two LED filaments together and tightening it, and
wherein at least two of the plurality of LED filaments are connected to one another or tied together by the at least one knot.

2. A light emitting device according to claim 1, and comprising a plurality of LED filaments, wherein the plurality of LED filaments comprises at least one knot in the form of intentional complication in cordage of one or two LED filaments of the plurality of LED filaments, and wherein the intentional complication in cordage is any one of a fastening made by looping one LED filament of the plurality of LED filaments on itself or together with a further LED filament of the plurality of LED filaments and tightening it, and an intentional complication in cordage in which at least one LED filament of the plurality of LED filaments is interlaced with at least one further LED filament of the plurality of LED filaments at right angles to one another.

3. A light emitting device according to claim 1, wherein the at least one LED filament, or the one or two LED filaments of the plurality of LED filaments, comprise more than one knot.

4. A light emitting device according to claim 1, wherein the at least one LED filament comprises at least one point of contact with itself within the at least one knot, or wherein at least two of the plurality of LED filaments comprise at least one point of mutual contact within the at least one knot.

5. A light emitting device according to claim 1, wherein the at least one knot is chosen from the group comprising an overhand knot, a double overhand knot, a FIG. 8 knot, a granny knot, a square knot, a woven knot and combinations thereof.

6. A light emitting device according to claim 2, wherein each LED filament of the plurality of LED filaments is adapted for, in operation, emitting light of the same color, or wherein at least one LED filament of the plurality of LED filaments is adapted for, in operation, emitting light of a different color than that of the other LED filaments of the plurality of LED filaments.

7. A light emitting device according to claim 1, wherein the at least two LED filaments comprise a reflective material, a luminescent material or a combination of a reflective material and a luminescent material.

8. A light emitting device according to claim 7, wherein the concentration of the luminescent material varies along a longitudinal extension of the at least two LED filaments.

9. A light emitting device according to claim 1, and further comprising at least one luminescent filament.

10. A light emitting device according to claim 1, wherein a thickness of the encapsulation varies along a longitudinal extension of the at least one LED filament and/or between LED filaments.

11. A light emitting device according to claim 1, wherein the encapsulation encapsulates the flexible substrate on both sides.

12. A light emitting device according to claim 1, wherein the flexible substrate is light transmissive.

13. A light emitting device according to claim 1, and further comprising a controller configured to control the at least one LED filament or to individually control two or more LED filaments of the plurality of LED filaments.

14. A lamp, a luminaire or a lighting fixture, or a shade for a lamp, a luminaire or a lighting fixture, comprising a light emitting device according to claim 1.

* * * * *